United States Patent
Nishimura et al.

(10) Patent No.: US 11,000,783 B2
(45) Date of Patent: May 11, 2021

(54) PUMPING APPARATUS, TREATMENT SOLUTION SUPPLYING DEVICE, AND SUBSTRATE TREATING APPARATUS

(71) Applicant: SCREEN Holdings Co., Ltd., Kyoto (JP)

(72) Inventors: Junki Nishimura, Kyoto (JP); Hiroyuki Ogura, Kyoto (JP); Masahito Kashiyama, Kyoto (JP); Toru Momma, Kyoto (JP); Shoji Kirita, Kyoto (JP); Hidetoshi Sagawa, Kyoto (JP); Shogo Yoshida, Kyoto (JP)

(73) Assignee: SCREEN Holdings Co., Ltd.

( * ) Notice: Subject to any disclaimer, the term of this patent is extended or adjusted under 35 U.S.C. 154(b) by 188 days.

(21) Appl. No.: 16/045,891

(22) Filed: Jul. 26, 2018

(65) Prior Publication Data
US 2019/0060789 A1 Feb. 28, 2019

(30) Foreign Application Priority Data

Aug. 30, 2017 (JP) .............................. JP2017-165763

(51) Int. Cl.
*B01D 19/00* (2006.01)
*H01L 21/67* (2006.01)
(Continued)

(52) U.S. Cl.
CPC ..... *B01D 19/0042* (2013.01); *B01D 19/0052* (2013.01); *B01D 19/0057* (2013.01);
(Continued)

(58) Field of Classification Search
CPC .......... F04B 43/02; F04B 43/08; F04B 43/10; F04B 23/02; F04B 23/04; F04B 23/06;
(Continued)

(56) References Cited

U.S. PATENT DOCUMENTS

| 2002/0131875 A1 | 9/2002 | Yajima ........................... 417/313 |
| 2005/0238504 A1 | 10/2005 | Yajima ........................... 417/394 |

(Continued)

FOREIGN PATENT DOCUMENTS

| CN | 1691282 A | 11/2005 |
| CN | 101665030 A | 3/2010 |

(Continued)

OTHER PUBLICATIONS

English machine translation of the description of KR-100948629-B1 dated 2010 (Year: 2010).*

(Continued)

*Primary Examiner* — Nathan C Zollinger
(74) *Attorney, Agent, or Firm* — Ostrolenk Faber LLP

(57) ABSTRACT

A chamber has a first opening, a second opening, and a third opening. The second opening is higher in level than the first and third openings, and is located at the highest position of a reservoir. Air bubbles are easily collected around the second opening, higher in level than the third opening, due to buoyancy. Moreover, the chamber includes an upper slope on an upper inner wall thereof such that a sectional area of the chamber becomes smaller toward the highest position of the reservoir. The upper slope causes the air bubbles not to stagnate but to be guided to the second opening along the upper slope. This makes easy discharge of the air bubbles from the chamber.

4 Claims, 11 Drawing Sheets

(51) Int. Cl.
  *B05C 11/10* (2006.01)
  *F04B 43/02* (2006.01)
(52) U.S. Cl.
  CPC .............. *B05C 11/10* (2013.01); *F04B 43/02* (2013.01); *H01L 21/67017* (2013.01); *H01L 21/6719* (2013.01)
(58) Field of Classification Search
  CPC .......... F04B 23/10; F04B 53/16; F04B 53/20; F04B 7/0076; F04B 49/22; F04F 1/06; F04F 1/12; H01L 21/67023; H01L 21/6719; H01L 21/67017; B01D 19/0042; B01D 19/0052; B05C 11/10
  See application file for complete search history.

(56) References Cited

U.S. PATENT DOCUMENTS

| | | | |
|---|---|---|---|
| 2006/0268078 A1 | 11/2006 | Kumagai | 347/85 |
| 2007/0128047 A1 | 6/2007 | Gonnella et al. | 417/2 |
| 2008/0169230 A1 | 7/2008 | Nakagawa | 210/188 |
| 2009/0084720 A1 | 4/2009 | Dannenmaier et al. | 210/188 |
| 2010/0058985 A1 | 3/2010 | Kim et al. | 118/720 |
| 2011/0098864 A1 | 4/2011 | Gonnella et al. | 700/282 |
| 2011/0228021 A1 | 9/2011 | Kobayashi et al. | 347/93 |
| 2013/0004340 A1 | 1/2013 | Gonnella et al. | 417/53 |
| 2014/0034584 A1 | 2/2014 | Marumoto et al. | 210/808 |
| 2014/0174475 A1 | 6/2014 | Takayanagi et al. | 134/18 |
| 2017/0232460 A1* | 8/2017 | Kashiyama | H01L 21/67017 239/590 |
| 2019/0060963 A1 | 2/2019 | Nishimura et al. | |

FOREIGN PATENT DOCUMENTS

| | | |
|---|---|---|
| CN | 102205723 A | 10/2011 |
| CN | 202180644 U | 4/2012 |
| CN | 103567110 A | 2/2014 |
| CN | 109427621 A | 3/2019 |
| EP | 1532994 A1 | 5/2005 |
| JP | H07-045001 B2 | 5/1995 |
| JP | 2006-272661 A | 10/2006 |
| JP | 2009-049228 A | 3/2009 |
| JP | 2010-067978 A | 3/2010 |
| JP | 2010-096816 A | 4/2010 |
| JP | 2013-100825 A | 5/2013 |
| JP | 2017-144372 A | 8/2017 |
| KR | 10-0948629 B1 | 3/2010 |
| KR | 100948629 B1 * | 3/2010 |
| KR | 10-1517303 B1 | 5/2015 |

OTHER PUBLICATIONS

Office Action dated Apr. 16, 2019 for corresponding Taiwan Patent Application No. 107126308.
Office Action dated Sep. 2, 2019 for corresponding Chinese Patent Application No. 201810857496.2.
Office Action dated Dec. 18, 2019 for corresponding Korean Patent Application No. 10-2018-0087116.
Office Action dated May 27, 2020 for corresponding Chinese Patent Application No. 201810857496.2.

* cited by examiner

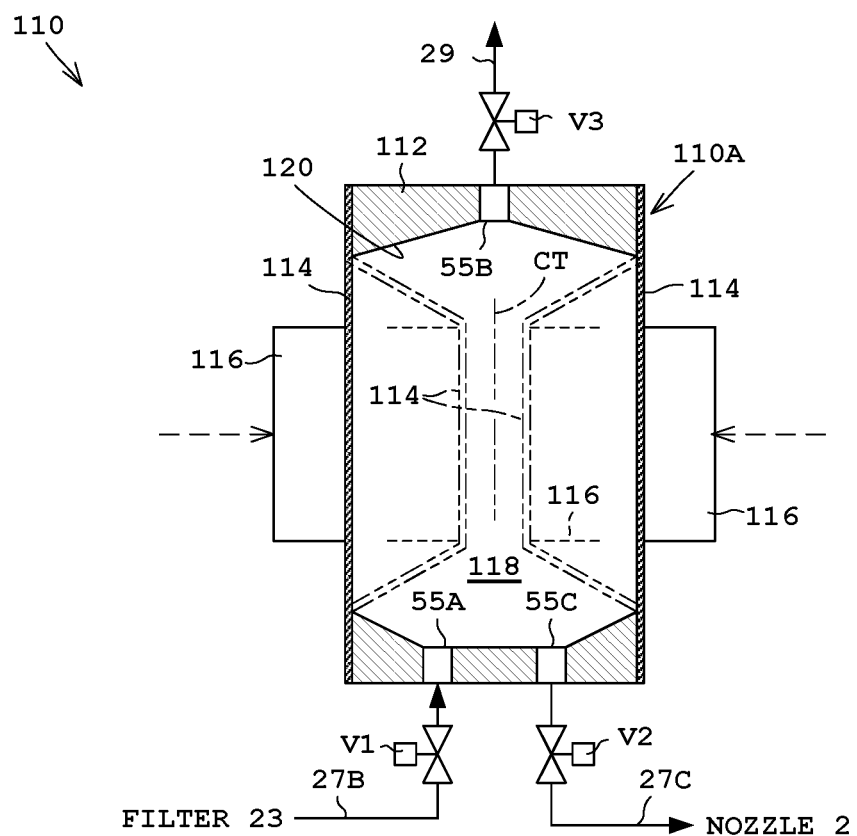

PUMPING APPARATUS, TREATMENT SOLUTION SUPPLYING DEVICE, AND SUBSTRATE TREATING APPARATUS

CROSS-REFERENCE TO RELATED APPLICATIONS

This application claims priority to Japanese Patent Application No. 2017-165763 filed Aug. 30, 2017, the subject matter of which is incorporated herein by reference in entirety.

BACKGROUND OF THE INVENTION

Technical Field

The present invention relates to a pumping apparatus, a treatment solution supplying device, and a substrate treating apparatus for supplying a treatment solution to substrates such as semiconductor substrates, glass substrates for liquid crystal display, glass substrates for photomask, and optical disk substrates.

Description of the Related Art

A substrate treating apparatus includes a holding rotator that holds a substrate horizontally and rotates the held substrate, a nozzle that discharges a treatment solution to the substrate held with the holding rotator, and a pumping apparatus that feeds the treatment solution to the nozzle.

The pumping apparatus includes a chamber with a reservoir as an interior space that stores a treatment solution and a movable part that contacts the reservoir, a volume of the reservoir being changed by displacement of the movable part; and a drive mechanism for displacing the movable part. See, for example, Japanese Unexamined Patent Publication No. 2009-049228. The chamber includes an inlet on its lower part, and an outlet at its upper part. Specifically, the treatment solution flows the inlet on a lower part of the chamber, and flows out from the outlet at the upper part of the chamber. Such a configuration is made in order to drain air bubbles (air) present in the treatment solution reliably from the chamber. The treatment solution from the outlet on the upper part of the chamber is fed into a nozzle.

In addition, Japanese Unexamined Patent Publication No. 2013-100825 discloses multi-stage pumps with a first stage pump, a filter, and a second stage pump. The first stage pump feeds a liquid via the filter to the second stage pump. The second stage pump also includes a purge valve for discharging the liquid. The liquid discharged through the purge valve returns to the first stage pump.

SUMMARY OF INVENTION

With the above configuration, that is, when the treatment solution flows into the reservoir through the inlet on the lower part of the chamber, and flows out from the outlet at the upper part of the chamber, air bubbles may flow out from the outlet together with the treatment solution and the air bubbles may be discharged through the nozzle. The treatment solution with the air bubbles that are discharged from the nozzle onto the substrates may lead to defective products.

In order to avoid such a problem, the following is required. That is, a mechanism such as a capacitive sensor that detects air bubbles or a mechanism that traps the air bubbles is provided on a pipe extending between the outlet on the upper part of the chamber and the nozzle. This causes the system to undergo complication. Moreover, such a complicated configuration may lower a degree of cleanness (quality) of the treatment solution. The treatment solution is brought into flow for keeping the degree of cleanness of the treatment solution. This increases a usage amount of the treatment solution. Consequently, another configuration is required to prevent the air bubbles in the treatment solution from being fed out from the outlet of the chamber. Furthermore, when the air bubbles are hard to be discharged from the reservoir, another problem may arise that the air bubbles are fed out from the outlet with high possibility. Accordingly, such a configuration is required as to feed out the air bubbles stagnated in the reservoir easily from the reservoir.

The present invention has been made regarding the state of the art noted above, and a primary object of the present invention is to provide a pumping apparatus, a treatment solution supplying device, and a substrate treating apparatus that allow easy discharge of air bubbles from a chamber. The present invention has been made regarding the state of the art noted above, and a secondary object of the present invention is to provide a pumping apparatus, a treatment solution supplying device, and a substrate treating apparatus that avoids feeding out of air bubbles in a treatment solution from a specific opening of the chamber.

SOLUTION TO PROBLEM

The present invention is constituted as stated below to achieve the above object. One aspect of the present invention provides a pumping apparatus for feeding a treatment solution. The pumping apparatus includes: a chamber with a reservoir as an interior space that stores the treatment solution and a movable part that contacts the reservoir, a volume of the reservoir being changed by displacement of the movable part; and a drive unit that displaces the movable part; the chamber having at least three openings, or a first opening, a second opening, and a third opening, formed therein that are in communication with the reservoir, the second opening being higher in level than the first opening and the third opening, and located at a highest position in level of the reservoir, the chamber including a slope on an upper inner wall thereof such that an upper sectional area of the reservoir becomes smaller toward the highest position of the reservoir, and the second opening discharging air bubbles within the treatment solution guided along the slope.

With the pumping apparatus according to the present invention, the chamber has the three openings, or the first opening, the second opening, and the third opening. The second opening is higher in level than the first and third openings, and is located at the highest position of the reservoir. Air bubbles are easily collected around the second opening, higher in level than the third opening, due to buoyancy. Moreover, the chamber includes the slope on the upper inner wall thereof such that the upper sectional area of the reservoir becomes smaller toward the highest position of the reservoir. The slope causes the air bubbles not to stagnate but to be guided to the second opening along the slope. This makes easy discharge of the air bubbles from the chamber.

Moreover, it is preferable that the first opening and the third opening of the pumping apparatus mentioned above are disposed around a bottom of the reservoir. This enables large separation of the first opening and the third opening from the second opening. Accordingly, this achieves such a satisfactory effect that the air bubbles floating due to buoyancy are prevented from approaching to the first opening and the third opening. This results in largely reduced possibility of feeding out the air bubbles from the openings other than the second opening.

It is also preferred that in the pumping apparatus mentioned above that the reservoir of the chamber forms a frustum with a horizontal central axis, the frustum being surrounded by a first flat face, a second flat face, and a cylindrical circumference face, the first flat face extending vertically, the second flat face being smaller than and parallel to the first flat face, and the cylindrical circumference face being formed by connecting an outer edge of the first flat face and an outer edge of the second flat face, the first opening and the third opening are disposed around a bottom of the reservoir in the frustum shape, the second opening is located at the highest position in level in the reservoir formed in the frustum shape, and the slope is formed by the upper inner wall of the chamber that corresponds to an upper portion of the cylindrical circumference face.

This achieves easy formation of the slope that is inclined in two directions in total, or a first transverse direction from the first flat face to the second flat face, and a second transverse direction orthogonal to the first transverse direction. Moreover, this forms the slope easily that guides air bubbles to the highest position in a punctiform. Moreover, since the second flat face has an area smaller than the first flat face where the movable part is disposed, the chamber of a compact configuration is obtainable. Moreover, since the first opening and the third opening are disposed around the bottom of the reservoir, these openings are separable from the second opening largely.

Moreover, it is preferable in the pumping apparatus mentioned above that the movable part is a diaphragm provided on the first flat face. This makes easy discharge of the air bubbles out of the chamber when the diaphragm is used for the movable part.

It is also preferred that in the pumping apparatus mentioned above that the reservoir of the chamber forms a frustum with a horizontal central axis, the frustum being surrounded by a first circular face, a second circular face, and a cylindrical circumference face, the first circular face extending vertically, the second circular face being smaller than and parallel to the first circular face, and the cylindrical circumference face being formed by connecting an outer edge of the first circular face and an outer edge of the second circular face. It is assumed, for example, that an outer edge of a pentagonal first flat face is connected to an outer edge of a pentagonal second flat face to form the cylindrical circumference face. In this case, five creases are typically put in the circumference face. In contrast to this, with the present invention, the cylindrical circumference face without any crease is formable smoothly.

Moreover, it is preferred in the exemplary pumping apparatus mentioned above that the second opening extends obliquely upward on a wall of the chamber from the inside to the outside. This avoids stagnation of the air bubbles partway of the second opening, i.e., between the inside and the outside of the chamber wall.

It is preferred in the exemplary pumping apparatus mentioned above that the upper portion of the reservoir of the chamber has a conical shape or a pyramidal shape whose central axis is vertical, the second opening is located at the highest position in level of the reservoir in the conical shape or the pyramidal shape, and the slope is formed by the upper inner wall of the chamber that corresponds to a conical face or the pyramidal face of the reservoir in the conical shape or the pyramidal shape. The slope causes the air bubbles not to stagnate but to be guided to the second opening along the slope. This makes easy discharge of the air bubbles from the chamber.

Moreover, in the exemplary pumping apparatus mentioned above, it is preferred that the movable part is an elastic tubular member whose central axis is disposed vertically and the tubular member surrounds the reservoir, and the drive unit changes the volume of the reservoir by moving a body of the tubular member, the first opening and the third opening are formed around the bottom of the reservoir, the chamber includes a conical slope or a pyramidal slope such that a sectional area of the reservoir becomes smaller toward the highest position of the reservoir, and the second opening discharging air bubbles within the treatment solution guided along the slope.

The tubular member is used for the movable part. The tubular member has the central axis disposed vertically and surrounds the reservoir. Moreover, the tubular member is elastic. The first opening and the third opening are formed around the bottom of the reservoir. The second opening is disposed at the highest position of the conical reservoir. Moreover, the chamber includes the conical slope such that the upper sectional area of the reservoir becomes smaller toward the highest position of the reservoir. The slope causes the air bubbles not to stagnate but to be guided to the second opening along the slope. This makes easy discharge of the air bubbles from the chamber.

Moreover, it is preferred in the pumping apparatus mentioned above that the first opening is used for sucking the treatment solution into the reservoir and the third opening is used for feeding out the treatment solution within the reservoir by controlling circulation of the fluid in synchronization with the displacement of the movable part. That is, the treatment solution is sucked through the first opening into the reservoir, and is fed out through the third opening out of the reservoir. The second opening is higher in level than the first and third openings, and is located at the highest position of the reservoir. Air bubbles are easily collected around the second opening, higher in level than the third opening, due to buoyancy. This allows prevention of the air bubbles in the treatment solution from being fed out of the third opening of the chamber.

Another aspect of the present invention provides a treatment solution supplying device for feeding a treatment solution. The treatment solution supplying device includes: a filter that filters the treatment solution; a downstream pumping apparatus that is provided downstream of the filter and sucks the treatment solution filtered through the filter and feeds out the treatment solution; a controller that controls drive of the downstream pumping apparatus and circulation of the treatment solution; the downstream pumping apparatus including a chamber with a reservoir as an interior space that stores the treatment solution and a movable part that contacts the reservoir, a volume of the reservoir being changed by displacement of the movable part; and a drive unit that displaces the movable part; the chamber having at least three openings, or a first opening, a second opening, and a third opening, formed therein that are in communication with the reservoir, the second opening being higher in level than the first opening and the third opening, and located at the highest position in level of the reservoir, the chamber including a slope on an upper inner wall thereof such that an upper sectional area of the reservoir becomes smaller toward the highest position of the reservoir, and the second opening discharging air bubbles within the treatment solution guided along the slope, the controller performing control of the circulation of the treatment solution among the first opening, the second opening, and the third opening in synchronization with displacement of the movable part of the downstream pumping apparatus, whereby the downstream pumping apparatus sucks the treatment solution filtered through the filter via the first opening, thereafter discharges the air bubbles within the treatment solution guided along the slope via the second opening at the beginning of feeding out the sucked treatment solution, and then feeds out a remaining part of the sucked treatment solution within the reservoir via the third opening.

With the treatment solution supplying device according to the present invention, the chamber has the three openings, or the first opening, the second opening, and the third opening. The second opening is higher in level than the first and third openings, and is located at the highest position of the reservoir. Air bubbles are easily collected around the second opening, higher in level than the third opening, due to buoyancy. Moreover, the chamber includes the slope on the upper inner wall thereof such that the upper sectional area of the reservoir becomes smaller toward the highest position of the reservoir. The slope causes the air bubbles not to stagnate but to be guided to the second opening along the slope. Consequently, this allows easy discharge of the air bubbles from the chamber while the air bubbles in the treatment solution are prevented from being fed out from the third opening of the chamber.

Moreover, the controller performs control of circulation of the treatment solution among the first opening, the second opening, and the third opening in synchronization with the displacement of the movable part of the downstream pumping apparatus. With such control, the downstream pumping apparatus sucks the treatment solution filtered through the filter via the first opening, thereafter discharges the air bubbles within the treatment solution guided along the slope via the second opening at the beginning of feeding out the sucked treatment solution, and then feeds out a remaining part of the sucked treatment solution within the reservoir via the third opening. This allows discharge of the air bubbles within the treatment solution via the second opening before feeding the treatment solution out of the reservoir via the third opening. Moreover, the air bubbles within the treatment solution are guided along the slope into the second opening. This achieves reduction in displacement amount of the movable part for discharging the air bubbles. Accordingly, the third opening is able to feed an increased amount of the treatment solution.

Moreover, another aspect of the present invention provides a substrate treating apparatus including the treatment solution supplying device mentioned above, and a nozzle provided at an end of a flow path connected to the third opening of the treatment solution supplying device.

The substrate treating apparatus according to the present invention allows prevention of the air bubbles within the treatment solution from being fed out via the third opening of the chamber and from being discharged through the nozzle.

Another aspect of the present invention provides a treatment solution supplying device for feeding a treatment solution. The treatment solution supplying device includes: a filter that filters the treatment solution; an upstream pumping apparatus that is provided upstream of the filter and feeds the treatment solution to the filter; a downstream pumping apparatus that is provided downstream of the filter and sucks the treatment solution filtered through the filter and feeds out the treatment solution; a controller that controls drive of the upstream pumping apparatus and the downstream pumping apparatus and circulation of the treatment solution; the upstream pumping apparatus and the downstream pumping apparatus each including a chamber with a reservoir as an interior space that stores the treatment solution and a movable part that contacts the reservoir, a volume of the reservoir being changed by displacement of the movable part; and a drive unit that displaces the movable part; the chamber having at least three openings, or a first opening, a second opening, and a third opening, formed therein that are in communication with the reservoir, the second opening being higher in level than the first opening and the third opening, and located at a highest position in level of the reservoir, the chamber including a slope on an upper inner wall thereof such that an upper sectional area of the reservoir becomes smaller toward the highest position of the reservoir, and the second opening discharging air bubbles within the treatment solution guided along the slope, the controller performing control of the circulation of the treatment solution among the first opening, the second opening, and the third opening of each of the upstream pumping apparatus and the downstream pumping apparatus in synchronization with displacement of the movable part of each of the upstream pumping apparatus and the downstream pumping apparatus, whereby the upstream pumping apparatus sucks the treatment solution via the first opening, thereafter feeds the sucked the treatment solution via the second opening to the filter along with the air bubbles in the treatment solution guided along the slope, and whereby the downstream pumping apparatus sucks the treatment solution filtered through the filter via the first opening, thereafter discharges air bubbles within the treatment solution guided along the slope via the second opening at the beginning of feeding out the sucked treatment solution, and feeds out a remaining part of the sucked treatment solution within the reservoir via the third opening, and the treatment solution containing the air bubbles discharged from the second opening of the downstream pumping apparatus is caused to return to the upstream pumping apparatus via the third opening of the upstream pumping apparatus.

With the treatment solution supplying device according to the present invention, the chamber has the three openings, or the first opening, the second opening, and the third opening. The second opening is higher in level than the first and third openings, and is located at the highest position of the reservoir. Air bubbles are easily collected around the second opening, higher in level than the third opening, due to buoyancy. Moreover, the chamber includes the slope on the upper inner wall thereof such that the sectional area of the chamber becomes smaller toward the highest position of the reservoir. The slope causes the air bubbles not to stagnate but to be guided to the second opening along the slope. Consequently, this allows easy discharge of the air bubbles from the chamber while the air bubbles in the treatment solution are prevented from being fed out from the third opening of the chamber.

Moreover, the downstream pumping apparatus allows discharge of the air bubbles within the treatment solution via the second opening before feeding the treatment solution out of the reservoir via the third opening. Moreover, the air bubbles within the treatment solution are guided along the slope into the second opening. Accordingly, the downstream pumping apparatus achieves reduction in displacement amount of the movable part for discharging the air bubbles. Accordingly, the third opening is able to feed an increased amount of the treatment solution. Moreover, the air bubbles within the treatment solution are guided along the slope into the second opening. Accordingly, the upstream pumping apparatus achieves easy supply of the air bubbles to the filter that filters the air bubbles from the second opening.

Moreover, another aspect of the present invention provides a substrate treating apparatus including the treatment solution supplying device mentioned above, and a nozzle provided at an end of a flow path connected to the third opening of the downstream pumping apparatus of the treatment solution supplying device.

The substrate treating apparatus according to the present invention allows prevention of the air bubbles within the treatment solution from being fed out via the third opening of the chamber and from being discharged through the nozzle.

ADVANTAGEOUS EFFECTS OF INVENTION

The pumping apparatus, the treatment solution supplying device, and the substrate treating apparatus of the present invention allow easy discharge of the air bubbles from the chamber.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIG. 14 is another modification of the pumping apparatus.

DESCRIPTION OF EMBODIMENTS

Embodiment 1

Figure 1:
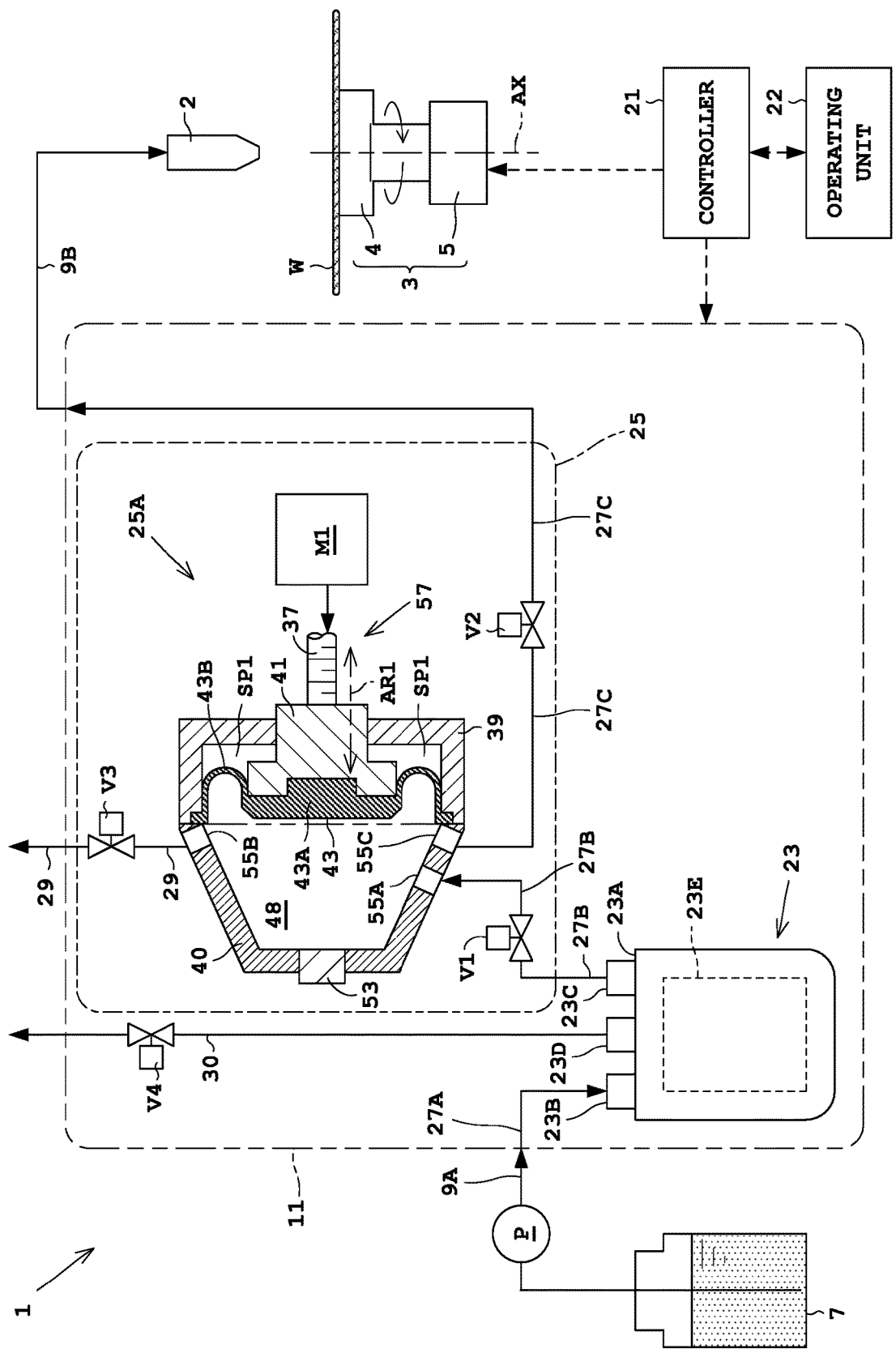
FIG. 1 schematically illustrates a substrate treating apparatus according to Embodiment 1.

The following describes Embodiment 1 of the present invention with reference to drawings. FIG. 1 schematically illustrates a substrate treating apparatus according to Embodiment 1.

Configuration of Substrate Treating Apparatus 1

Reference is made to FIG. 1. A substrate treating apparatus 1 includes a nozzle 2 and a holding rotator 3. The nozzle 2 discharges (dispenses) a treatment solution to a substrate W. Examples of the treatment solution used include a photoresist solution, a chemical for antireflection film formation, a developer, and a rinse liquid. Examples of the rinse liquid used include a solvent and deionized water (DIW). The holding rotator 3 rotates while holding the substrate W substantially horizontally.

The holding rotator 3 includes a spin chuck 4 and a rotary drive unit 5. The spin chuck 4 holds the substrate W in a rotatable manner around a rotation axis AX. The spin chuck 4 performs vacuum-suction to a rear face of the substrate W, for example. The rotary drive unit 5 causes the spin chuck 4 to rotate around the rotation axis AX. The rotary drive unit 5 is formed by an electric motor and the like.

The substrate treating apparatus 1 further includes a treatment solution container 7, pipes 9A and 9B, a pumping apparatus P, and a treatment solution supplying device 11. The treatment solution container (e.g., a bottle) 7 stores the treatment solution. The pipe 9A is connected to the treatment solution container 7. The pipe 9A is provided with the pumping apparatus P. The pumping apparatus P feeds the treatment solution from the treating liquid container 7 to the treatment solution supplying device 11 via the pipe 9A. The pumping apparatus P may feed inert gas, such as nitrogen gas, to the treating solution container 7, and pushes out the treatment solution from the treating solution container 7 to the pipe 9A with the fed inert gas.

The substrate treating apparatus 1 further includes a controller 21 and an operating unit 22. The controller 21 includes a processing central processing unit (CPU). The controller 21 controls each element of a downstream pumping apparatus 25 mentioned later, the treatment solution supplying device 11, and the substrate treating apparatus 1. For instance, the controller 21 controls on-off valves V1 to V4, and an electric motor M1, which are mentioned later. The operating unit 22 includes a display unit, a memory, and an input unit. The display unit is formed by a liquid crystal monitor, for example. The memory unit includes at least any of a read-only memory (ROM), a random-access memory (RAM), and a hard disk. The input unit includes at least any of a keyboard, a mouse, and various types of buttons. The memory unit stores various conditions and operation programs for substrate treatment.

Configuration of Treatment Liquid Supplying Device 11

The treatment solution supplying device 11 includes a filter 23, and the downstream pumping apparatus 25. The downstream pumping apparatus 25 includes a pump body 25A, and the on-off valves V1, V2, and V3.

The treatment solution within the treatment solution supplying device 11 flows in pipes 27A to 27C. The filter 23 for filtering the treatment solution is arranged between on the pipes 27A and 27B. The downstream pumping apparatus 25 (pump body 25A) is disposed between the pipes 27B and 27C. The on-off valve V1 is arranged on the pipe 27B, whereas the on-off valve V2 is arranged on the pipe 27C. The on-off valve V1 causes the treatment solution to flow into the pipe 27B, and causes the treatment solution to stop flowing. Likewise, the on-off valve V2 causes the treatment solution to flow into the pipe 27C, and causes the treatment solution to stop flowing. The downstream pumping apparatus 25 is connected to an exhaust pipe 29. The exhaust pipe 29 is provided with the on-off valve V3.

The filter 23 is detachable from the treatment solution supplying device 11. In addition, the filter 23 is replaceable. The filter 23 includes a top face 23A provided with an inlet (inflow port) 23B, an outlet (outflow port) 23C, and a vent 23D. The pipe 27A is connected to the inlet 23B, whereas the pipe 27B is connected to the outlet 23C. The vent 23D is connected to an exhaust pipe 30 for exhausting air bubbles. The on-off valve V4 is arranged on the exhaust pipe 30. The on-off valves V1 to V4 are, for example, composed by a normal close type that are normally closed. The vent 23D is an outlet for exhausting air bubbles and the like in the filter 23. The filter 23 includes a filter body 23E for filtering the treatment solution actually. The filter body 23E removes impurities such as air bubbles in the treatment solution. The vent 23D exhausts air bubbles or the treatment solution containing air bubbles prior to passage through the filter body 23E.

Figure 2:
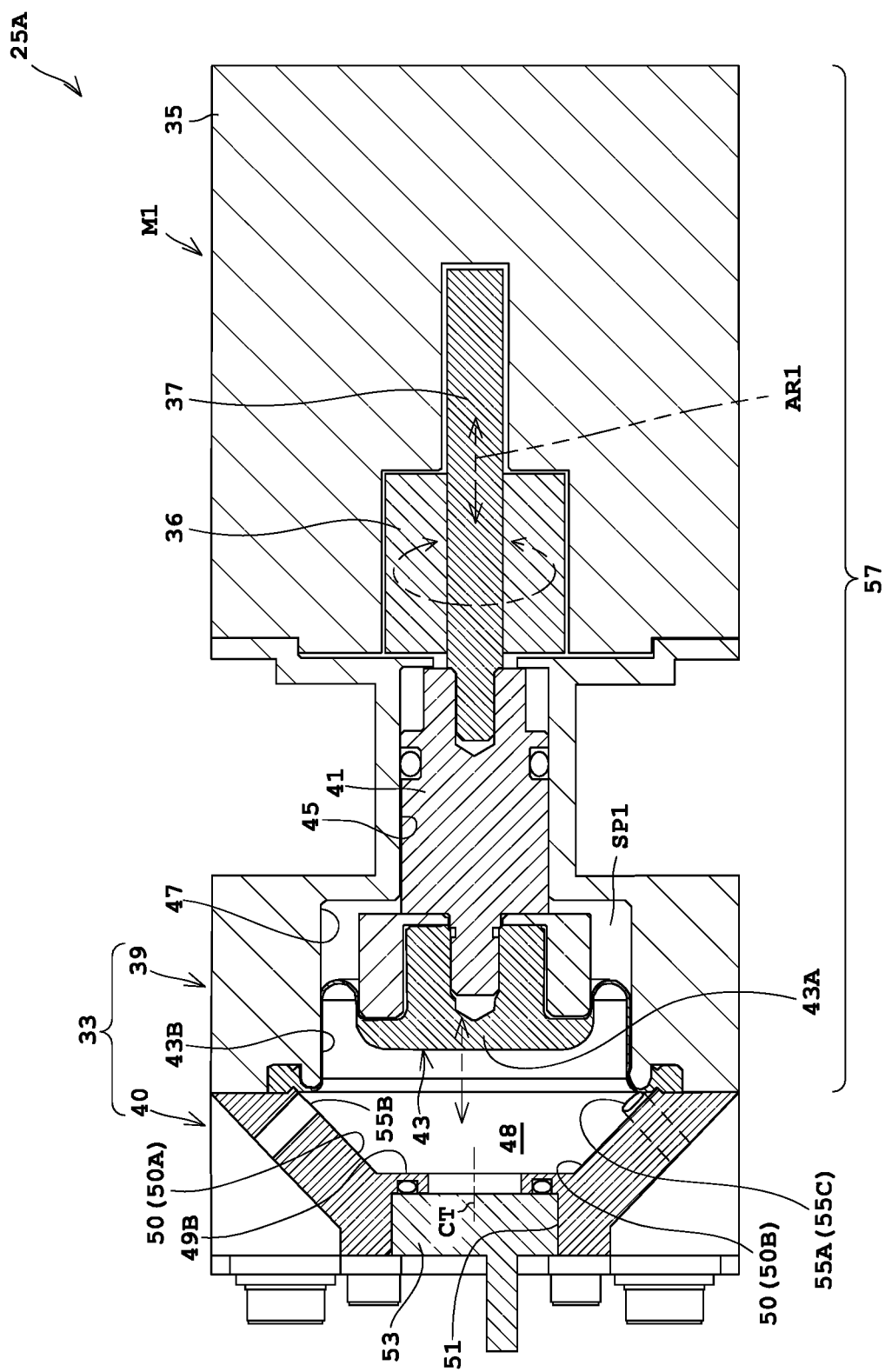
FIG. 2 is a longitudinal sectional view of a pump body.
Figure 3:
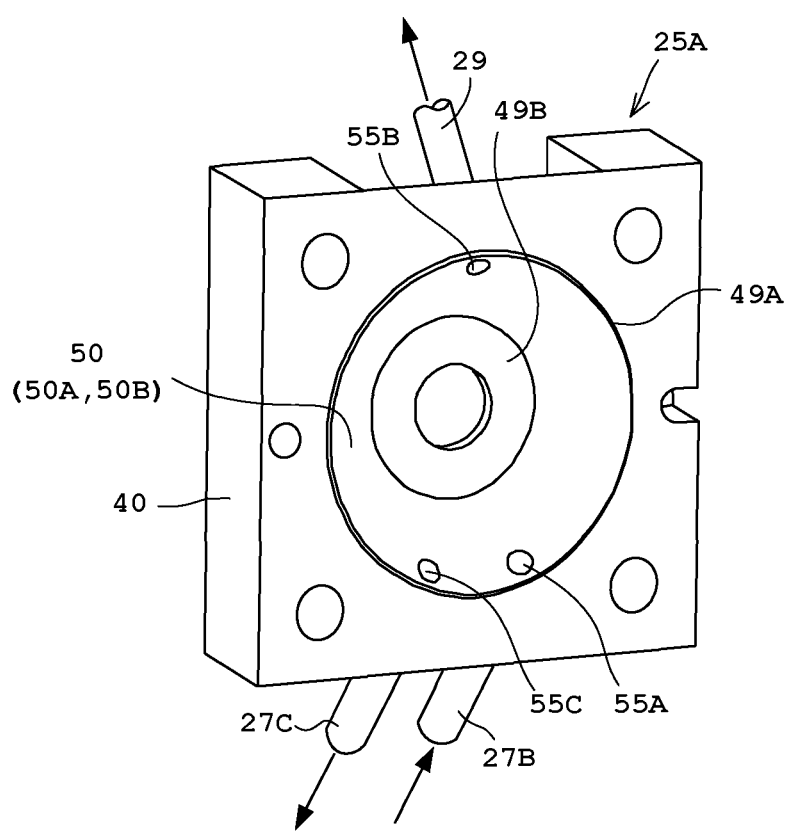
FIG. 3 is a perspective view of a chamber body seen from a diaphragm.

FIG. 2 is a longitudinal sectional view of a pump body 25A. FIG. 3 is a perspective view of a chamber body 40 seen from a diaphragm 43. The pump body 25A includes an electric motor M1 (hereinafter, referred to as a "motor M1") and a chamber 33. Examples of the motor M1 used include a stepping motor. Specifically, as illustrated in FIG. 2, the motor M1 includes a stator 35, a cylindrical rotor 36, and a shaft (screw shaft) 37. The stator 35 generates a magnetic field along an inner side thereof. The rotor 36 is disposed in the inner side of the stator 35 in a rotatable manner and is rotated by the stator 35. The shaft 37 is screwed in a hollow part of the rotor 36 and reciprocates relative to the rotor 36 by rotation of the rotor 36.

The chamber 33 is attached to the motor M1. The chamber 33 includes a guide unit 39, and a chamber body 40 for storing the treatment solution. The chamber 33 causes a diaphragm 43 mentioned later to be displaced, whereby a volume of the reservoir 48 is changed. The guide unit 39 has a guide pin 41 inserted thereinto. The guide pin 41 has a first end coupled to the shaft 37. The guide pin 41 has a second end coupled to a thick portion 43A of the diaphragm 43 adjacent to the chamber body 40. The guide unit 39 includes a guide hole 45. The guide hole 45 guides the guide pin 41 horizontally as indicated by the arrow AR1 in FIG. 2 without rotating the guide pin 41 around the shaft 37. In other words, a screw of the rotor 36 is engaged with a screw of the shaft 37. When the rotation of the rotor 36 is transmitted to the shaft 37, the guide pin 41 coupled to the shaft 37 is guided horizontally as indicated by the arrow AR1 without being rotated around the shaft 37 by the guide hole 45.

The guide unit 39 includes a recess 47 adjacent to the chamber body. The recess 47 accommodates the thick portion 43A at the center of the diaphragm 43 and the second end of the guide pin 41. The diaphragm 43 is provided so as to contact the reservoir 48. The diaphragm 43 is fixed such that an outer edge of a thin portion 43B thereof is nipped with a mating face of the guide unit 39 and the chamber body 40. That is, the outer edge of the thin portion 43B of the diaphragm 43 is attached to an inner wall of the recess 47 or the chamber body 40 to form a part of the inner wall of the chamber body 40. The diaphragm 43 separates the reservoir 48 (in of the chamber body 40) from a space SP1 adjacent to the guide pin 41. The diaphragm 43 is made of resin such as polytetrafluoroethylene (PTFE). Here, the thick portion 43A are formed in a cylindrical shape having an axis illustrated by the arrow AR1.

The reservoir 48 adjacent to the recess 47 is disposed in the chamber body 40. The reservoir 48 is formed in a truncated cone shape as in FIGS. 2 and 3. The truncated cone is disposed such that a central axis CT (see FIG. 4A) thereof is horizontal. The reservoir 48 is an interior space of the chamber body 40, and stores the treatment solution. The interior of the chamber body 40, or the reservoir 48, is surrounded by the first circular face 49A, the second circular face 49B (see FIG. 4A), and a cylindrical circumference face 50.

The first circular face 49A is formed by a circular flat face, and extends vertically. The circular face 49A is formed on an interface between the reservoir 48 and the recess 47, and corresponds to an opening. Accordingly, a thick portion 43A of the diaphragm 43 is moved into the reservoir 48 across the first circular face 49A. Here, the first circular face 49A has a diameter slightly larger than the inner wall of the recess 47.

The second circular face 49B is formed by a circular flat face along the inner wall of the chamber body 40. The second circular face 49B has a diameter smaller than the diameter of the first circular face 49A, and is parallel to the first circular face 49A. The second circular face 49B is disposed opposite to the recess 47 across the first circular face 49A. The second circular face 49B is orthogonal to the shaft 37 in an axis direction (horizontal direction). As illustrated in FIG. 2, an inspecting opening 51 that brings communication between the reservoir 48 and the outside is formed on the inner wall of the chamber body 40 corresponding to the second circular face 49B. The inspecting opening 51 has a pressure sensor 53 attached thereto for measuring pressure within the reservoir 48.

The cylindrical circumference face 50 connects the outer edge of the first circular face 49A and the outer edge of the second circular face 49B. In this embodiment, the circumference face 50 includes an upper slope 50A and a lower slope 50B. The upper slope 50A corresponds to an upper part of the circumference face 50 above the central axis CT in FIG. 4A. That is, the upper slope 50A is formed by an upper inner wall of the chamber 33 (chamber body 40) corresponds to an upper portion of the cylindrical circumference face 50. The lower slope 50B corresponds to a lower part of the circumference face 50 below the central axis CT. Here, the slope corresponds to the upper slope 50A in the present invention.

As illustrated in FIGS. 2 and 3, the chamber body 40 includes three openings, or a first opening 55A, a second opening 55B, and a third opening 55C, that are in communication with the reservoir 48. As is apparent from the description hereunder, the first opening 55A in Embodiment 1 serves as an inflow port for feeding the treatment solution into the reservoir 48. The second opening 55B serves as a discharge port for discharging the treatment solution including the air bubbles in the reservoir 48. The third opening 55C serves as an outflow port for feeding out the treatment solution in the reservoir 48 to the nozzle 2.

The first opening 55A and the third opening 55C are provided on a lower part of the cylindrical circumference face 50 (lower slope 50B). Seen from the diaphragm 43, the first opening 55A and the third opening 55C are formed below the central axis (center portion) CT of the reservoir 48 (see FIG. 4A) in a symmetrical positional relationship across a vertical center line VL of the reservoir 48. That is, the first opening 55A and the third opening 55C are provided around the bottom (almost the lowest position) of the reservoir 48 (in the chamber body 40). Moreover, the second opening 55B is provided on an upper portion of the cylindrical circumference face 50 (upper slope 50A). Seen from the diaphragm 43, the second opening 55B is formed above the central axis CT of the reservoir 48 on a vertical center line VL of the reservoir 48. That is, the second opening 55B is provided higher in level than the first opening 55A and the third opening 55C. Moreover, the second opening 55B is provided at the highest position TP of the reservoir 48 (in the chamber body 40) in a truncated cone shape. Moreover, the second opening 55B is provided at a position including the highest position TP of the reservoir 48.

In this embodiment, the controller 21 controls the circulation of the fluid in synchronization with the displacement of the diaphragm 43. Accordingly, the first opening 55A and the third opening 55C are used for sucking the liquid into the reservoir 48 through the first opening 55A and feeding out the treatment solution in the reservoir 48 through the third opening 55C.

The reservoir 48 is formed in a truncated cone shape. Accordingly, the chamber body 40 includes the upper slope 50 on the upper inner wall thereof such that the sectional area of the chamber body 40 becomes smaller toward the highest position TP of the reservoir 48. This causes the air bubbles to be guided to the second opening 55B, thereby avoiding stagnation of the air bubbles in the reservoir 48.

Moreover, as illustrated in FIG. 2, the first opening 55A, the second opening 55B, and the third opening 55C are formed in the chamber body 40 so as to extend orthogonally to the circumference face 50. The second opening 55B extends obliquely upward on the wall of the chamber 33 (chamber body 40) from the inside to the outside. This avoids stagnation of the air bubbles partway of the second opening 55B, i.e., between the inside and the outside of the wall of the chamber 33. Moreover, the second opening 55B extends obliquely upward, whereby a pipe is easily connected to the second opening 55 from the left in FIG. 2. As a result, the treatment solution supplying device 11 of a compact configuration is obtainable. The second opening 55B is available as long as it does not extend on the wall of the chamber 33 horizontally or downwardly. Moreover, the second opening 55B may extend upwardly at right angles.

The first opening 55A is connected to the pipe 27B as in FIG. 1. The second opening 55B is connected to the exhaust pipe 29. The third opening 55C is connected to the pipe 27. Note that since the third opening 55C overlaps the first opening 55A, the numeral "55A (55C)" is given to the third opening for illustrative convenience in FIG. 2. In addition, the nozzle 2 is provided at an end of the pipe (flow path) 27C, 9B connected to the third opening 55C. In this embodiment, the third opening 55C may be connected to the pipe 27B, and the first opening 55A may be connected to the pipe 27C. In other words, the two pipes 27B and 27C are connectable reversely.

The drive mechanism 57 displaces the diaphragm 43 for changing the volume of the reservoir 48. The drive mechanism 57 includes the motor M1, the shaft 37, the guide unit 39, the guide pin 41, the guide hole 45, and the recess 47. For instance, the diaphragm 43 (thick portion 43A) is moved into the reservoir 48, whereby the volume of the reservoir 48 decreases. The diaphragm 43 (thick portion 43A) is moved into the recess 47, whereby a space is generated in the recess 47 between the diaphragm 43 and the reservoir 48, leading to increase in volume of the reservoir 48. The drive mechanism 57 corresponds to the drive unit in the present invention.

Operation of Substrate Treating Apparatus 1

The following describes operation of the substrate treating apparatus 1. In FIG. 1, a substrate transport mechanism, not shown, transports the substrate W to the holding rotator 3. The holding rotator 3 suction-holds a rear face of the substrate W. Thereafter, a nozzle moving mechanism, not shown, moves the nozzle 2 from a standby position out of the substrate W to a given position above the center of the substrate W. After the nozzle 2 is moved, the treatment solution supplying device 11 feeds the treatment solution, supplied from the treatment solution container 7, to the nozzle 2 while the substrate W rotates or stops rotating. This causes the treatment solution to be discharged from the nozzle 2 on the substrate W. The pumping apparatus P feeds the treatment solution from the treating liquid container 7 to the treatment solution supplying device 11 via the pipe 9A.

When rotation of the substrate W is stopped during discharging the treatment solution, the substrate W is rotated for spreading the treatment solution over the substrate W.

After the treatment solution is discharged through the nozzle 2 to complete substrate treatment, the nozzle moving mechanism returns the nozzle 2 from the given position above the substrate W to the standby position. Thereafter, the holding rotator 3 releases its holding of the substrate W while the substrate W stops rotation. The substrate transport mechanism transports the substrate W from the holding rotator 3.

Operation of Treatment Liquid Supplying Device 11

The following describes operation of the treatment solution supplying device 11. The pumping apparatus P feeds the treatment solution from the treating liquid container 7 via the pipes 9A and 27A to an inlet 23B of the filter 23. Impurities such as air bubbles in the treatment solution, fed to the inlet 23B of the filter 23, are removed through the filter body 23E, and then the treatment solution is fed to the outlet 23C and the pipe 27B in this order. That is, the treatment solution is fed to the on-off valve V1.

[Step S01] Suction

The treatment solution supplying device 11 sucks the treatment solution into the chamber body 40, or the reservoir 48. The controller 21 performs control to drive the motor M1 to move the shaft 37 and the guide pin 41 backwardly toward the motor M1 (rightward in FIG. 2) while the on-off valves V2 to V4 are close and the on-off valve V1 is open. This causes the thick portion 43A of the diaphragm 43 to be accommodated into the recess 47 in a retracted state. By this operation, the treatment solution is sucked into the reservoir 48.

[Step S02] Discharge of Air Bubble (Purge)

After the Step S01 of sucking the treatment solution, the treatment solution supplying device 11 discharges the air bubbles from the second opening 55B provided in the chamber body 40. The controller 21 performs control to drive the motor M1 to move slightly the shaft 37 and the guide pin 41 forwardly toward the chamber body 40 (leftward in FIG. 2) while the on-off valves V1, V2, and V4 are close and the on-off valve V3 is open. At this time, the guide pin 41 is caused to move forwardly by a moving amount smaller than that of the guide pin 41 during Step S03 of discharging operation, which is to be mentioned later.

The following describes the case where the air bubbles are mixed in the treatment solution in the reservoir 48. When the air bubbles are present in the treatment solution in the reservoir 48, the air bubbles undergo buoyancy to float up. The air bubbles within the treatment solution are guided along the upper slope 50A into the second opening 55B. Detailed description is as under. The reservoir 48 is surrounded by the first circular face 49A, the second circular face 49B, and the cylindrical circumference face 50. The first circular face 49A extends vertically. The second circular face 49B has a diameter smaller than the first circular face 49A and is parallel to the first circular face 49A. The cylindrical circumference face 50 (the upper slope 50A, the lower slope 50B) is formed by connecting the outer edge of the first circular face 49A and the outer edge of the second circular face 49B.

Figure 4A:
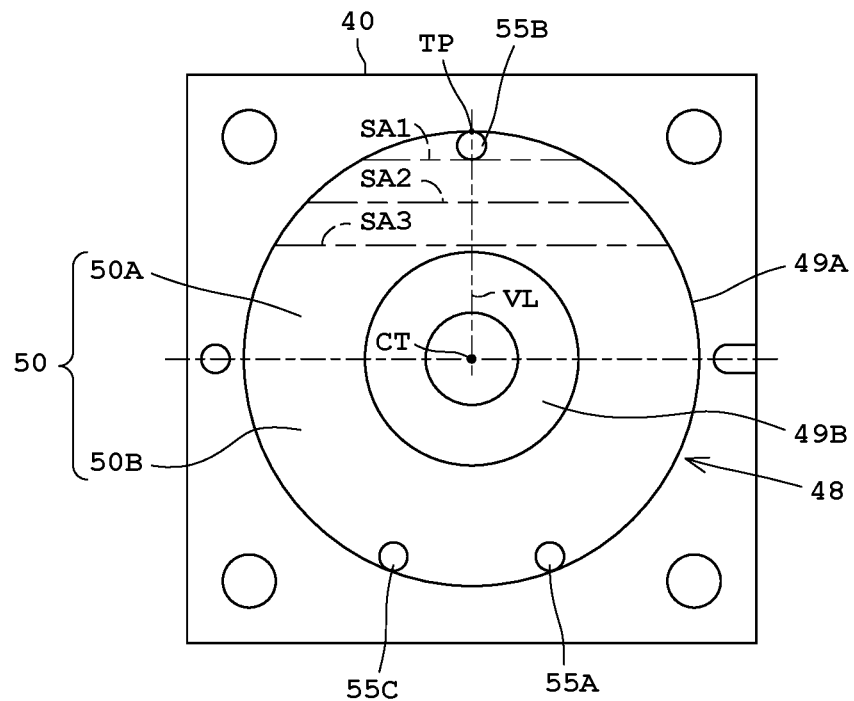
FIGS. 4A and 4B each illustrate an interior of the chamber body and a position of a second opening.
Figure 4B:
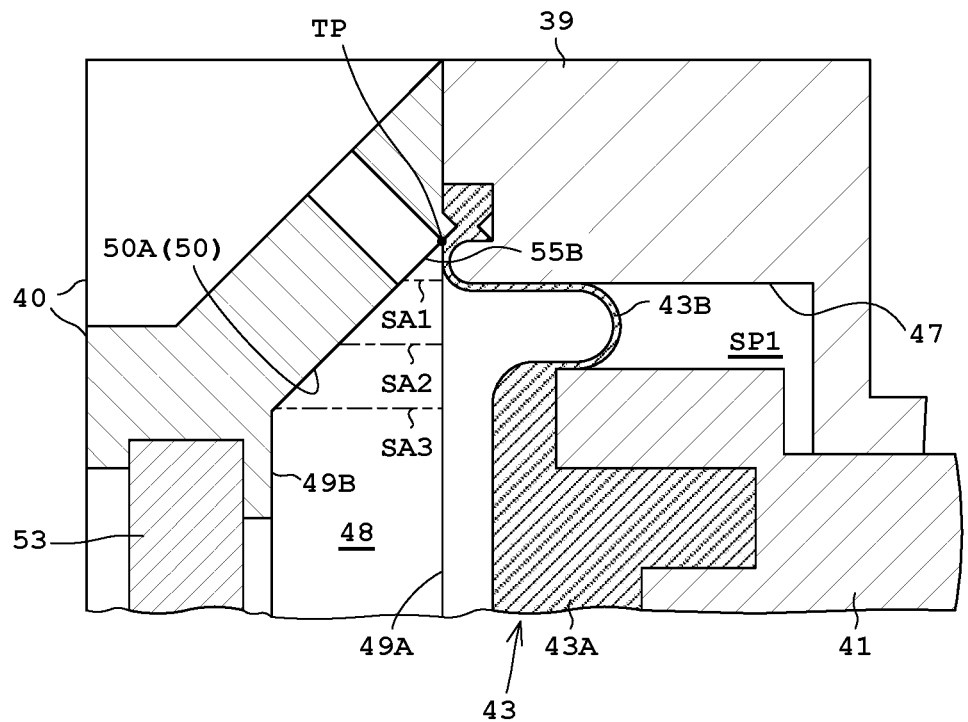

That is, as illustrated in FIGS. 4A and 4B, the chamber body 40 includes the upper slope 50A on the upper inner wall thereof such that the sectional area of the upper portion of the reservoir 48 becomes smaller toward the highest position TP of the reservoir 48. For instance, as illustrated in FIGS. 4A and 4B, the sectional areas SA1 to SA3 has a relationship of SA1<SA2<SA3, and the areas are smaller toward the highest position TP. In contrast to this, the second opening 55B is provided at a position including the highest position TP of the reservoir 48. Here, the case where the highest position TP is located on the outer edge of the second opening 55B also corresponds to the case where the position includes the "highest position TP". Accordingly, the air bubbles present in the treatment solution moves upwardly due to buoyancy or flow of the treatment solution while being guided along the upper slope 50A. Consequently, the air bubbles are easily collected at the second opening 55B.

Figure 5A:
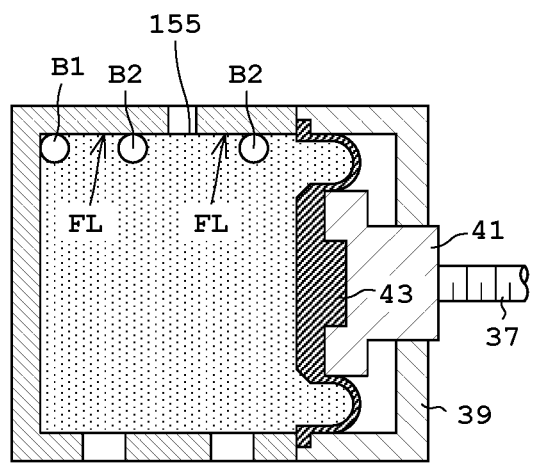
FIGS. 5A and 5B each illustrate effects of the present invention.
Figure 5B:
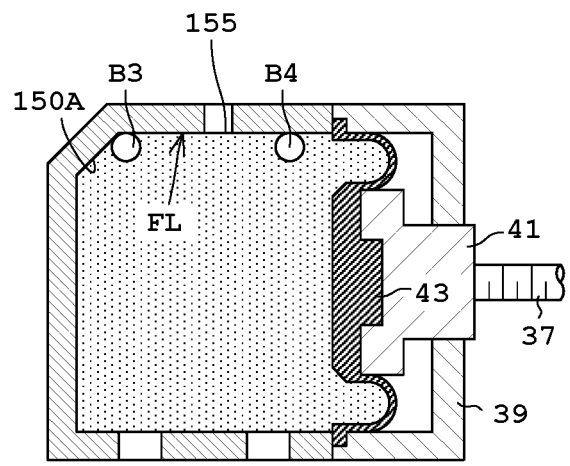

For instance, the upper inner wall of the chamber body 40 has no slope, air bubbles B1 may stagnate around a corner of the reservoir as in FIG. 5A. In addition, air bubbles B2 may stagnate on a horizontal plane FL (upper inner wall). Moreover, even when the slope 150A is provided as in FIG. 5B, air bubbles B3 may stagnate at a boundary between the slope 150A and the horizontal face FL if the second opening 155 does not include the highest position of the reservoir, i.e., the horizontal face FL is present. Accordingly, this leads to unsatisfactory guide of the slope 150A, which may cause stagnation of air bubbles B4 on the horizontal face FL.

[Step S03] Discharge (Feed Out)

After the Step S02 of discharging the air bubbles, the controller 21 performs control to drive the motor M1 to move the shaft 37 and the guide pin 41 further forwardly toward the chamber body 40 (leftward in FIG. 2) while the on-off valves V1, V3, and V4 are close and the on-off valve V2 is open. This causes the thick portion 43A of the diaphragm 43 to be moved forwardly to a position close to the second circular face 49B. By this operation, the treatment solution stored in the reservoir 48 is fed out. Then, the treatment solution pushed out from the downstream pumping apparatus 25 is fed via the pipes 27C, 9B, and the nozzle 2 in this order. The nozzle 2 discharges the treatment solution.

The following described the positional effect of the first opening 55A and the third opening 55C. As in FIGS. 3 and 4A, seen from the diaphragm 43, the first opening 55A and the third opening 55C are formed below the central axis CT of the reservoir 48 in a symmetrical positional relationship across a vertical center line VL of the reservoir 48. That is, the first opening 55A and the third opening 55C are provided around the bottom (almost the lowest position) of the reservoir 48 (in the chamber body 40).

The arrangement of the third opening 55C enables separation largely from the second opening 55B. Accordingly, this achieves such a satisfactory effect that the air bubbles floating due to buoyancy are prevented from approaching. This results in further reduced possibility of supplying the air bubbles from the third opening 55C. Since either the first opening 55A or the third opening 55C is disposed around the bottom (almost the lowest position), the treatment solution sucked into the reservoir 48 is preventable from stagnating around the bottom of the reservoir 48.

With the present embodiment, the chamber 33 includes the first opening 55A, the second opening 55B, and the third opening 55C formed therein. The second opening 55B is higher in level than the first opening 55A and the third opening 55C, and is located at the highest position of the reservoir 48. The air bubbles are easily collected around the second opening 55B, higher in level than the third opening 55C, due to buoyancy. Moreover, the chamber 33 includes the upper slope 50A on the upper inner wall thereof such that the upper sectional area SA1 to SA3 (see FIGS. 4A and 4B) of the chamber body 40 in the reservoir 48 becomes smaller toward the highest position TP of the reservoir 48. The upper slope 50A causes the air bubbles not to stagnate but to be guided to the second opening 55B along the upper slope 50A. Consequently, this allows easy discharge of the air bubbles from the chamber 33 while the air bubbles in the treatment solution are prevented from being fed out of the third opening 55C of the chamber 33.

Moreover, the reservoir 48 (in the chamber body 40) is surrounded by the first circular face 49A, the second circular face 49B, and the cylindrical circumference face 50. The first circular face 49A extends vertically. The second circular face 49B has a diameter smaller than the first circular face 49A and is parallel to the first circular face 49A. The cylindrical circumference face 50 (the upper slope 50A, the lower slope 50B) is formed by connecting the outer edge of the first circular face 49A and the outer edge of the second circular face 49B. The diaphragm 43 is provided opposite to the second circular face 49B across the first circular face 49A so as to contact the first circular face 49A.

This achieves easy formation of the upper slope 50A that is inclined in two directions in total, or a first transverse direction from the first circular face 49A to the second circular face 49B (see alternate long and short dashed lines with the numerals SA1 to SA3 in FIG. 4B), and a second transverse direction orthogonal to the first transverse direction (see alternate long and short dashed lines with the numerals SA1 to SA3 in FIG. 4A). Moreover, this forms the upper slope 50A easily that guides the air bubbles to the highest position TP in a punctiform. Moreover, since the second circular face 49B has an area smaller than the first circular face 49A where the diaphragm 43 is disposed, the chamber 33 of a compact configuration is obtainable. Moreover, since the first opening 55A and the third opening 55C are disposed around the bottom of the reservoir 48, these openings are separable from the second opening 55B largely. Accordingly, this achieves such a satisfactory effect that the air bubbles floating due to buoyancy are prevented from approaching to the first opening 55A and the third opening 55C. Consequently, this achieves prevention of air bubbles largely from being fed out of the reservoir 48 through the third opening 55C, for example, other than the second opening 55B.

Moreover, it is assumed, for example, that an outer edge of a first pentagonal face is connected to an outer edge of a second pentagonal face to form the cylindrical circumference face. In this case, five creases are typically put in the circumference face. In contrast to this, with the present embodiment, the smooth cylindrical circumference face 50 without any crease is formable. Moreover, this leads to easier work than that illustrated in FIGS. 8, 10, and 11, which is to be mentioned later. The reservoir 48 is formed in a truncated cone shape in this embodiment. Alternatively, the reservoir 48 may be in a cone shape or a pyramid shape.

Moreover, the controller 21 performs control of circulation of the treatment solution among the first opening 55A, the second opening 55B, and the third opening 55C in synchronization with the displacement of the diaphragm 43 of the downstream pumping apparatus 25. With such control, the downstream pumping apparatus 25 sucks the treatment solution filtered through the filter 23 via the first opening 55A, and thereafter discharges air bubbles within the treatment solution guided along the upper slope 50A via the second opening 55B at the beginning of feeding out the sucked treatment solution. Then, with the control, a remaining part of the treatment solution within the reservoir 48 is fed out via the third opening 55C.

This allows discharge of the air bubbles within the treatment solution via the second opening 55B before feeding the treatment solution out of the reservoir 48 via the third opening 55C. Moreover, the air bubbles within the treatment solution are guided along the upper slope 50A into the second opening 55B. This achieves reduction in displacement amount of the diaphragm 43 for discharging the air bubbles. Accordingly, the third opening 55C is able to feed an increased amount of the treatment solution.

Embodiment 2

The following describes Embodiment 2 of the present invention with reference to drawings. Here, the description common to that of Embodiment 1 is to be omitted. The treatment solution supplying device 11 of Embodiment 1 includes the single downstream pumping apparatus 25. In contrast to this, a treatment solution supplying device 71 of Embodiment 2 includes an upstream pumping apparatus 73 in addition to the downstream pumping apparatus 25.

Figure 6:
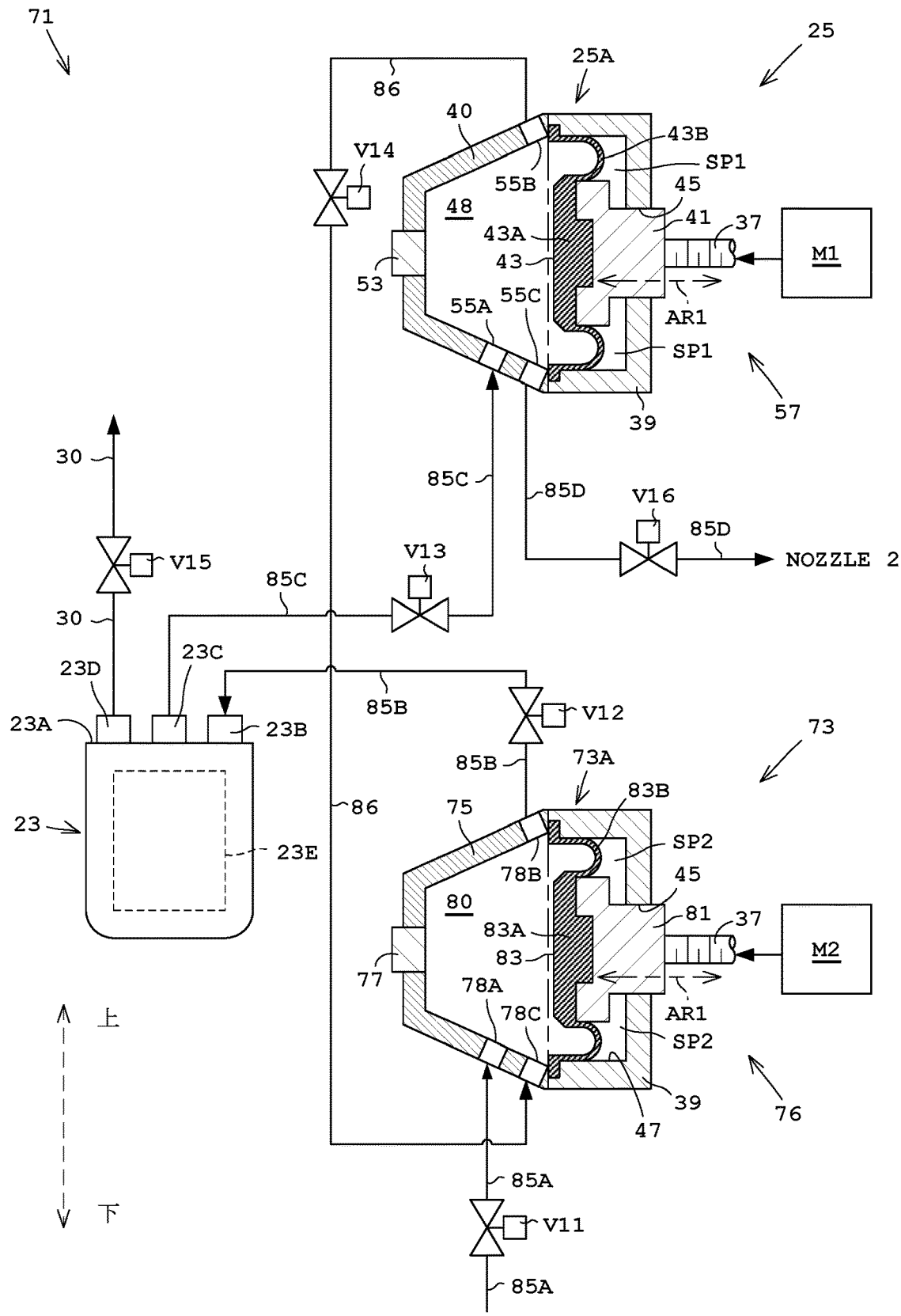
FIG. 6 schematically illustrates a treatment solution supplying device according to Embodiment 2.

FIG. 6 schematically illustrates a treatment solution supplying device 71 according to Embodiment 2. The treatment solution supplying device 71 includes the upstream pumping apparatus 73, the filter 23, and the downstream pumping apparatus 25. The upstream pumping apparatus 73 is provided upstream of the filter 23. The downstream pumping apparatus 25 is provided downstream of the filter 23.

The downstream pumping apparatus 25 includes the pump body 25A, and on-off valves V13, V14, and V16 as in Embodiment 1 and FIG. 6. The pump body 25A includes the chamber body 40, the diaphragm 43, the drive mechanism 57, the first opening 55A, the second opening 55B, the third opening 55C, and the pressure sensor 53. The reservoir 48 of the chamber body 40 includes an interior space for storing the treatment solution. The on-off valve V13 is provided on a pipe 85C that is connected to the first opening 55A. The on-off valve V14 is provided on a pipe 86 that is connected to the second opening 55B. The on-off valve V16 is provided on a pipe 85D that is connected to the third opening 55C. The drive mechanism 57 displaces the diaphragm 43 for changing the volume of the reservoir 48. As illustrated in FIG. 2, the drive mechanism 57 includes the motor M1, the shaft 37, the guide unit 39, the guide pin 41, the guide hole 45, and the recess 47. The details of the downstream pumping apparatus 25 are the same as in Embodiment 1.

The upstream pumping apparatus 73 has substantially the same configuration as the downstream pumping apparatus 25 in FIG. 2. That is, as in FIG. 6, the upstream pumping apparatus 73 includes a pump body 73A, and on-off valves V11, V12, and V14. The pump body 73A includes an electric motor M2 (hereafter, referred to as a "motor M2"), the chamber body 75, a drive mechanism 76, a pressure sensor 77, a first opening 78A, a second opening 78B, and a third opening 78C. The on-off valve V11 is provided on a pipe 85A that is connected to the first opening 78A. The on-off valve V12 is provided on a pipe 85B that is connected to the second opening 78B. The on-off valve V14 is provided on a pipe 86 that is connected to the third opening 78C. The upstream pumping apparatus 73 and the downstream pumping apparatus 25 commonly use the on-off valve V14. The reservoir 80 of the chamber body 75 includes an interior space for storing the treatment solution. The drive mechanism 76 displaces the diaphragm 83 for changing the volume of the reservoir 80.

As illustrated in FIGS. 2 and 6, the drive mechanism 76 includes the motor M2, an upstream shaft 37, an upstream guide unit 39, an upstream guide pin 81, an upstream guide hole 45, and an upstream recess 47. Here, the same numerals are given to elements, other than the motor M2, the guide pin 81, and the diaphragm 83, as in the downstream pumping apparatus 25. The guide pin 81 is guided horizontally as indicated by the arrow AR1. The diaphragm 83 includes a thick portion 83A and a thin portion 83B. The thick portion 83A at the center portion of the diaphragm 83 is coupled to the second guide pin 81. The outer edge of the thin portion 83B of the diaphragm 83 is attached to an upper inner wall of the upstream guide unit 39, an upper inner wall of the upstream chamber body 75, or an upper portion of the recess 47. The diaphragm 83 forms a part of the inner wall of the upstream chamber body 75. The diaphragm 83 separates the reservoir 80 from a space SP2 adjacent to the guide pin 81. Rotation by the motor M2 is converted into linear movement by a rotator, not shown, the upstream shaft 37 and the upstream guide hole 45.

As illustrated in FIG. 6, the upstream chamber body 75 includes the first opening 78A, the second opening 78B, and the third opening 78C. The third opening 78C causes the treatment solution returned from the downstream pumping apparatus 25 to flow. The first opening 78A and the third opening 78C are provided around the bottom (almost the lowest position) in the reservoir 80 in a frustum shape within the chamber body 75. Similar to the second opening 55B, the second opening 78B is provided higher in level than the first opening 78A and the third opening 78C, and is disposed at the highest position TP of the reservoir 80. Moreover, the second opening 78B is provided at a position including the highest position TP.

The treatment solution within the treatment solution supplying device 71 flows in pipes 85A to 85D and a pipe 86. The pipe 85A connects the pipe 9A, shown in FIG. 1, to the first opening 78A of the upstream pumping apparatus 73. The pipe 85B connects the second opening 78B of the upstream pumping apparatus 73 to the inlet 23B of the filter 23. The pipe 85C connects the outlet 23C of the filter 23 to the first opening 55A of the downstream pumping apparatus 25. The pipe 85D connects the third opening 55C of the downstream pumping apparatus 25 to the pipe 9B in FIG. 1. The nozzle 2 is provided at ends of the pipes 85D and 9B connected to the third opening 55C of the downstream pumping apparatus 25. A return pipe 86 connects the second opening 55B of the downstream pumping apparatus 25 to the third opening 78C of the upstream pumping apparatus 73.

The on-off valve V11 is arranged on the pipe 85A. The on-off valve V12 is arranged on the pipe 85B. The on-off valve V13 is arranged on the pipe 85C. The on-off valve V16 is arranged on the pipe 85D. An on-off valve V15 is arranged on the exhaust pipe 30. The on-off valve V14 is arranged on the pipe 86. FIG. 6 differs from FIG. 2 in position of the first opening 55A, the second opening 55B, and the third opening 55C for easy understanding. Actually, the first opening 55A, the second opening 55B, and the third opening 55C are positioned as in FIGS. 2 and 3. This is as with FIGS. 1, and 7.

Operation of Treatment Liquid Supplying Device 71

The following describes operation of the treatment solution supplying device 71. FIGS. 7A to 7E each illustrate operation of the treatment solution supplying device 71.

[Step T01] Ready

Figure 7A:
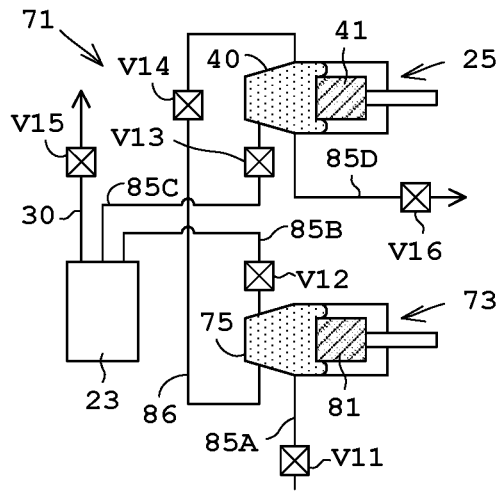
FIGS. 7A to 7E each illustrate operation of the treatment solution supplying device according to Embodiment 2.

Firstly, described is a ready step illustrated in FIG. 7A. By a suction step, a filtering step, a purge step, and a discharge step, the controller 21 causes the treatment solution to be brought into a suction condition in the chamber body 75 of the upstream pumping apparatus 73 and the chamber body 40 of the downstream pumping apparatus 25 as illustrated in FIG. 7A. Note that the on-off valves V11 to V16 are close in FIG. 7A.

[Step T02] Discharge

Figure 7B:
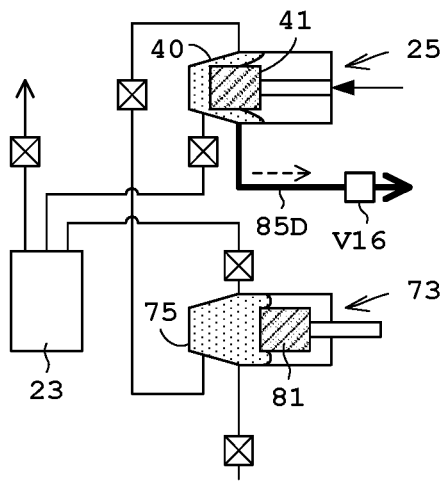

FIG. 7B illustrates the discharge step. The controller 21 causes the guide pin 41 of the downstream pumping apparatus 25 to move forwardly to the left while the on-off valves V11 to V15 are close and the on-off valve V16 is open. This causes the treatment solution sucked into the second chamber body 40 of the downstream pumping apparatus 25 to be fed through the nozzle 2 where the treatment solution is discharged.

[Step T03] Filtering

Figure 7C:
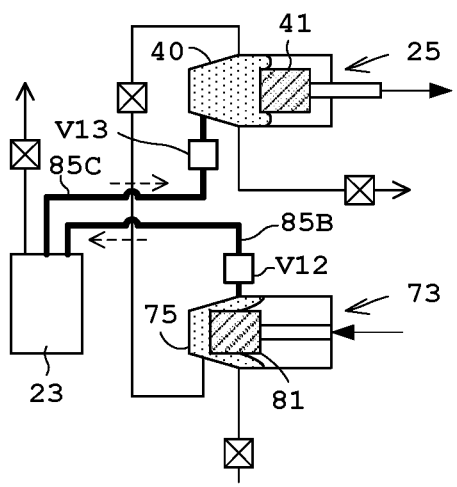

FIG. 7C illustrates the filtering step. In FIG. 7B, the treatment solution is kept sucked in the chamber body 75 of the upstream pumping apparatus 73. The treatment solution is sucked through the filter 23 into the second chamber body 40 of the downstream pumping apparatus 25. That is, the controller 21 causes the guide pin 81 of the upstream pumping apparatus 73 to move forwardly to the left and causes the guide pin 41 of the downstream pumping apparatus 25 backwardly to the right while the on-off valves V11 and V14 to V16 are close and the on-off valves V12 and V13 are open. This causes the impurities such as the air bubbles in the treatment solution within the chamber body 75 of the upstream pumping apparatus 73 to be removed with the filter 23, and the treatment solution is fed into the chamber body 40 of the downstream pumping apparatus 25.

[Step T04] Purge

Figure 7D:
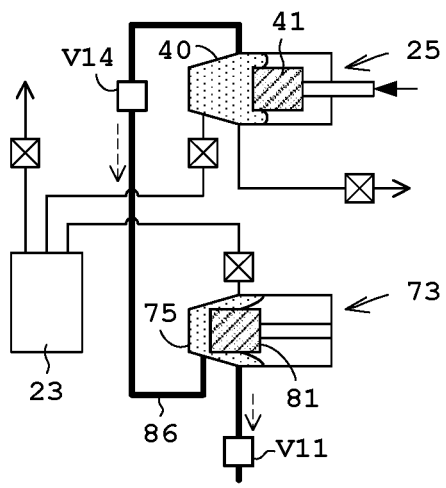

FIG. 7D illustrates the purge step. The controller 21 causes the guide pin 41 of the downstream pumping apparatus 25 to move slightly forwardly to the left while the on-off valves V12, V13, V15, and V16 are close and the on-off valves V11 and V14 are open. Accordingly, as in Embodiment 1, the air bubbles collected in the second opening 55B are able to return back to the chamber body 75 of the upstream pumping apparatus 73 via the return pipe 86 together with the treatment solution. The air bubbles back into the chamber body 75 are removed through the filter 23 in the following filtering step.

[Step T05] Suction

Figure 7E:
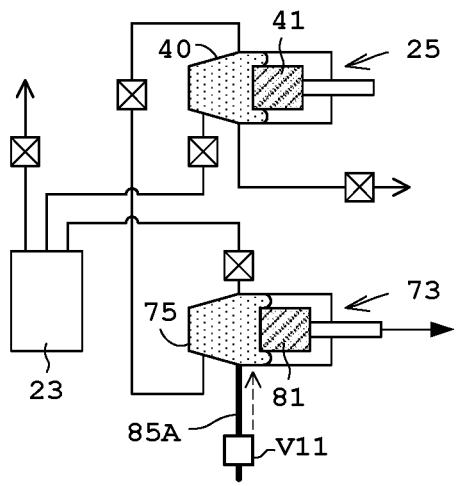

FIG. 7E illustrates the suction step. The controller 21 causes the guide pin 81 of the upstream pumping apparatus 73 to move backwardly to the right while the on-off valves V12 to V16 are close and the on-off valve V11 is open. This causes the treatment solution to be sucked in the chamber body 75 of the upstream pumping apparatus 73. Moreover, this leads to the situation like the ready step in FIG. 7A. The Steps T01 to T05 are repeated.

The discharge step and the suction step are performed simultaneously in the case of successive discharge. In this case, the discharge step and the suction step (Steps T02 and T05), the filtering step (Step T03), and the purge (Step T04) are repeated in this order, for example. When the air bubbles are discharged via the vent 23D of the filter 23, the controller 21 causes the guide pin 81 of the upstream pumping apparatus 73 to move forwardly to the left while the on-off valves V11, V13, V14, and V16 are close and the on-off valve V12 and V15 are open. Accordingly, impurities such as the air bubbles prior to passage through the filter body 23E are able to be discharged via the exhaust pipe 30.

With the present embodiment, the treatment solution supplying device 71 includes the two pumps (the upstream pumping apparatus 73 and the downstream pumping apparatus 25) across the filter 23, whereby the treatment solution and the air bubbles are able to be discharged from the downstream pumping apparatus 25 to the upstream pumping apparatus 73 via the return pipe 86. Such a configuration also achieves the same effect of the downstream pumping apparatus 25 as that of Embodiment 1.

Moreover, the controller 21 performs control of circulation of the treatment solution among the first opening 78A and 55A, the second opening 78B and 55B, and the third opening 78C and 55C of the upstream pumping apparatus 73 and the downstream pumping apparatus 25, respectively, in synchronization with the displacement of the diaphragms 43 and 83 of the upstream pumping apparatus 73 and the downstream pumping apparatus 25, respectively. With such control, the upstream pumping apparatus 73 sucks the treatment solution via the first opening 78A, and thereafter discharges sucked treatment solution together with the air bubbles within the treatment solution guided along the upper slope 50A via the second opening 78B to the filter 23. Moreover, the downstream pumping apparatus 25 sucks the treatment solution filtered through the filter 23 via the first opening 55A, and thereafter discharges air bubbles within the treatment solution guided along the upper slope 50A via the second opening 55B at the beginning of feeding out the sucked treatment solution. Then, a remaining part of the treatment solution within the reservoir 48 is fed out via the third opening 55C. The treatment solution containing the air bubbles discharged from the second opening 55B of the downstream pumping apparatus 25 is caused to return to the upstream pumping apparatus 73 via the third opening 78C of the upstream pumping apparatus 73.

In the downstream pumping apparatus 25, this allows discharge of the air bubbles within the treatment solution via the second opening 55B before feeding the treatment solution out of the reservoir 48 via the third opening 55C. Moreover, in the downstream pumping apparatus 25, the air bubbles within the treatment solution are guided along the upper slope 50A into the second opening 55B. This achieves reduction in displacement amount of the diaphragm 43 for discharging the air bubbles. Accordingly, the third opening 55C is able to feed an increased amount of the treatment solution. Moreover, the air bubbles within the treatment solution are guided along the upper slope 50A (see FIGS. 3, 4A and 4B) into the second opening 78B. Accordingly, the upstream pumping apparatus 73 achieves easy supply of the air bubbles to the filter 23 that filters the air bubble from the second opening 78B.

The present invention is not limited to the foregoing examples, but may be modified as follows.

(1) In Embodiment 1 mentioned above, the air bubbles are discharged with the treatment solution from the second opening 55B provided in the chamber body 40 via the exhaust pipe 29. Alternatively, the exhaust pipe 29 may be returned to the upstream of the filter 23. For instance, the exhaust pipe 29 may be returned to a trap tank, not shown, that is disposed between the pump P and the filter 23. In this case, the air bubbles may be removed by the trap tank or the filter 23, and the treatment solution discharged from the second opening 55B together with the air bubbles may be fed into the downstream pumping apparatus 25 again.

Figure 8:
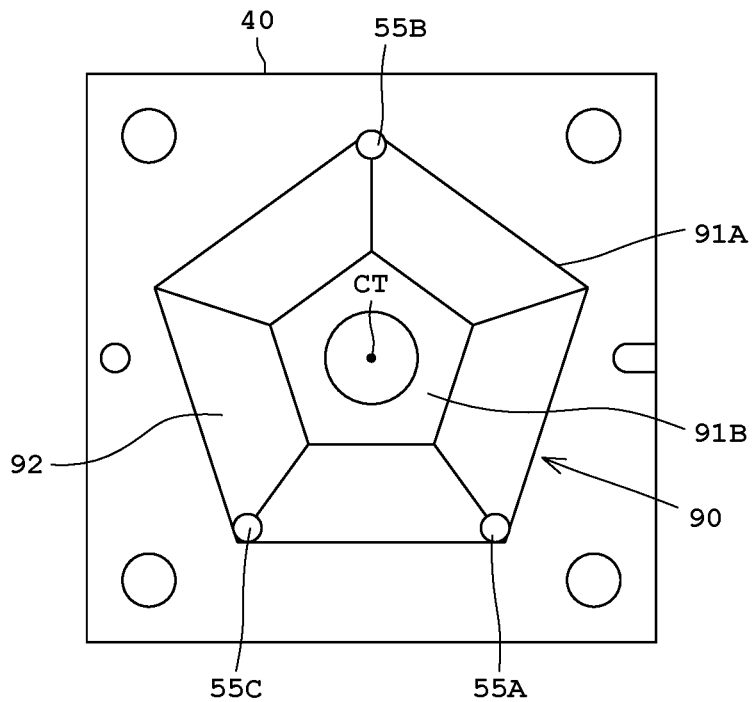
FIG. 8 is a modification of a chamber body.

(2) In each of the foregoing embodiments and the modification (1), the reservoir 48, 80 (in the chamber 40, 75, respectively) is formed in a truncated cone shape. Alternatively, the reservoir 48, 80 may be formed in a truncated pyramid shape such that the second opening 55B is disposed at the position including the lowest position TP of the reservoir 48, 80. FIG. 8 is another modification of a reservoir 90 formed in the truncated pyramid shape. The reservoir 90 (in the chamber body 40, 75) is surrounded by a first pentagonal face (regular pentagonal face) 91A, a second pentagonal face 91B (regular pentagonal face), and a cylindrical circumference face 92. The first pentagonal face 91A extends vertically. The second pentagonal face 91B has a diameter smaller than the first pentagonal face 91A and is parallel to the first pentagonal face 91A. The cylindrical circumference face 92 is formed by connecting the outer edge of the first pentagonal face 91A and the outer edge of the second pentagonal face 91B. Here, the first pentagonal face 91A corresponds to an opening. Moreover, the first pentagonal face 91A and the second pentagonal face 91B are not necessarily regular pentagonal. In addition, the frustum of the present invention includes a truncated cone and a truncated pyramid.

Figure 9:
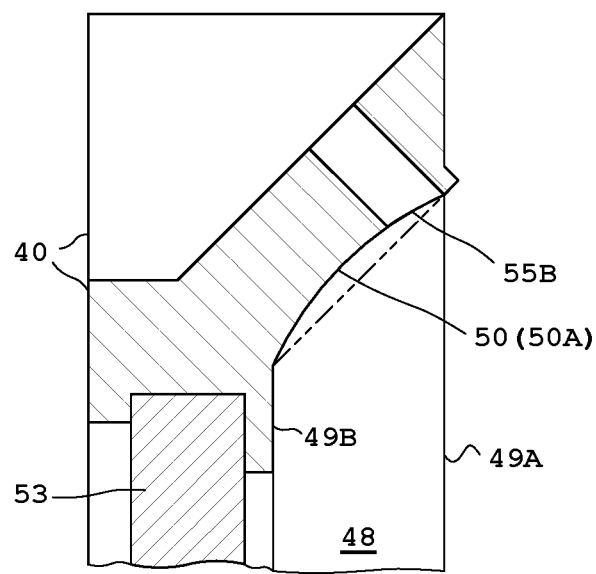
FIG. 9 is another modification of the chamber body.

(3) In each of the foregoing embodiments and the modifications, as illustrated by chain double-dashed lines in FIG. 9, the cylindrical circumference face 50 connecting the outer edge of the first circular face 49A and the outer edge of the second circular face 49B has a linear section. Alternatively, as illustrated in solid lines in FIG. 9, the circumference face 50 may have an annularly curved section so as to be recessed from the reservoir 48, 80 to the outside of the chamber body 40, 75.

Figure 10:
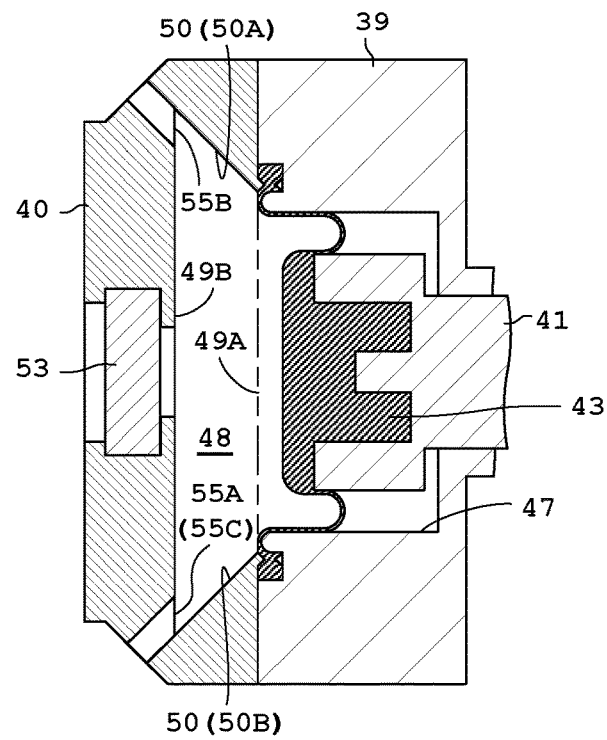
FIG. 10 is another modification of the chamber body.
Figure 11:
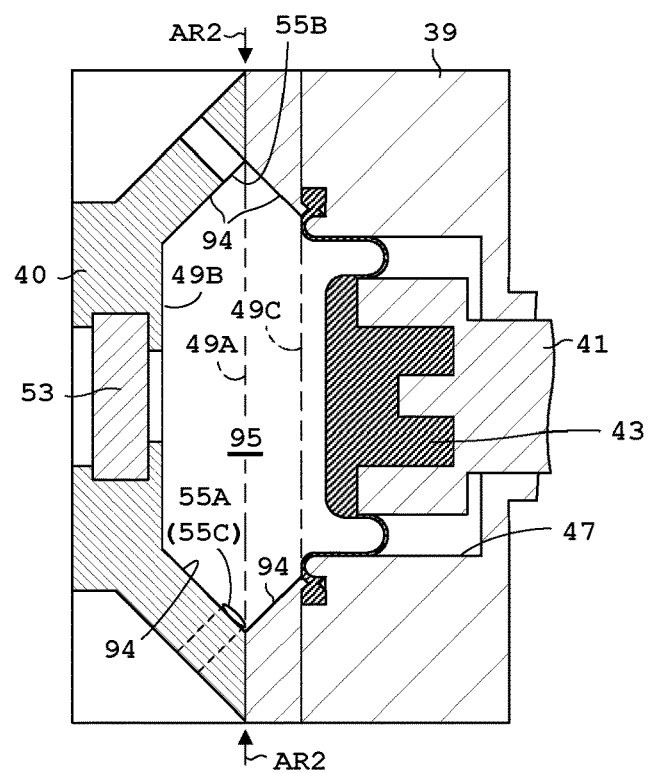
FIG. 11 is another modification of the chamber body.

(4) In each of the foregoing embodiments and the modifications, in the reservoir 48 (80) in FIG. 2, the second circular face 49B adjacent to the pressure sensor 53 has a diameter smaller than that of the first circular face 49A. Alternatively, as illustrated in FIG. 10, the second circular face 49B may have a diameter larger than that of the first circular face 49A.

(5) In each of the foregoing embodiments and the modifications, the reservoir 48 (80) is formed in a truncated cone shape as in FIG. 2. Alternatively, a reservoir 95 may be formed by two truncated cones across the first circular face 49A as in FIG. 11. Specifically, the reservoir 95 is surrounded by the first circular face 49A, the second circular face 49B, a third circular face 49C, and a cylindrical circumference face 94. The cylindrical circumference face 94 is formed by connecting the outer edge of the first circular face 49A, the outer edge of the second circular face 49B, and an outer edge of the third circular face 49C. The third circular face 49C has a diameter smaller than the diameter of the first circular face 49A, and is parallel to the first circular face 49A. In addition, the third circular face 49C is disposed opposite to the second circular face 49B across the first circular face 49A. In addition, the second opening 55B is provided at a position including the highest position TP of the reservoir 48, 80. Here, the third circular face 49C corresponds to an opening. The chamber body 40, 75 provided with the reservoir 95 as above may be formed by two members obtained by dividing the chamber body 40, 75 along the arrow AR2.

Figure 12A:
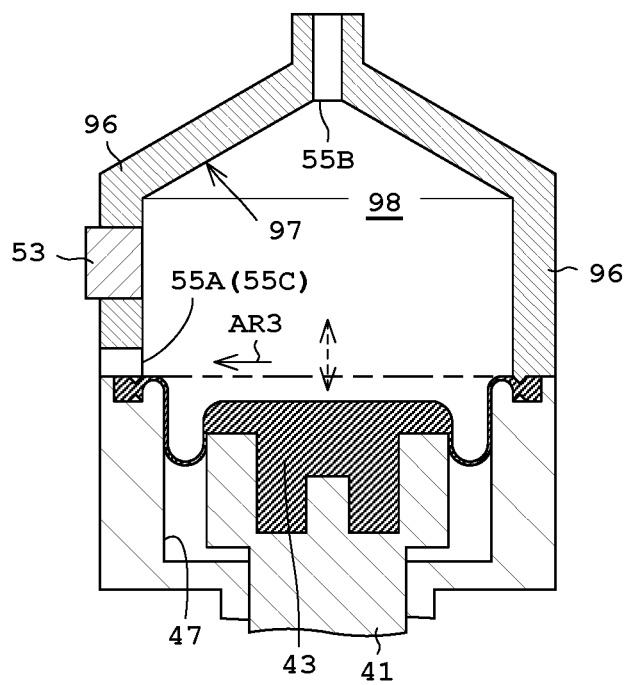
FIG. 12A is a modification of a pumping apparatus.
Figure 12B:
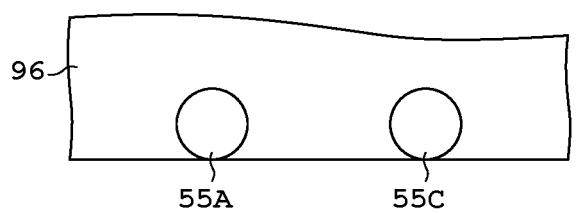
FIG. 12B illustrates a first opening and a third opening seen from the arrow AR3 in FIG. 12A.

(6) In each of the foregoing embodiments and the modifications, the guide pin 41 (81) moves horizontally in the downstream pumping apparatus 25 (the upstream pumping apparatus 73) as in FIG. 2. Alternatively, the guide pin 41 (81) may move vertically as in FIG. 12A. In this case, the second opening 55B is located at the highest position of a slope 97 with a conical face or pyramidal face provided on an upper part of the chamber body 96, or at the highest position of the reservoir 98. Moreover, the second opening 55B is provided at a position including the highest position. FIG. 12B illustrates the first opening 55A and the third opening 55C seen from the arrow AR 3 in FIG. 12A that are provided around the bottom of the chamber body 96.

Figure 13A:
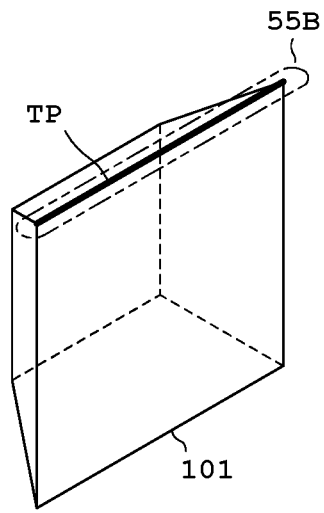
FIG. 13A illustrates a second opening with the highest position in a linear shape.
Figure 13B:
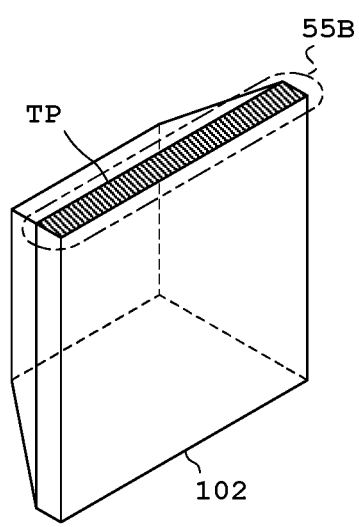
FIG. 13B illustrates a second opening with the highest position in a sheet shape.

(7) In each of the foregoing embodiments and the modifications, it is assumed that there are some cases where the highest position TP of a reservoir 101 has a linear shape as n FIG. 13A, or where the highest position TP of a reservoir 102 has a planar shape as in FIG. 13B. In this case, the second opening 55B may be formed so as to include the linear or planar highest TP. That is, as illustrated by chain double-dashed lines in FIGS. 13A and 13B, the second opening 55B may be formed in a slit opening.

(8) In each of the foregoing embodiments and the modifications, the treatment solution supplying device 11, 71 includes no nozzle 2, and the pipe 9B. Alternatively, the treatment solution supplying device 11, 71 may include at least any of the nozzle 2, the pipe 9A, 9B, the pumping apparatus P, and the treating liquid container 7.

(9) In each of the foregoing embodiments and the modifications, the diaphragm 43 used is a rolling diaphragm as in FIG. 2. However, the diaphragm 43 may be another type of diaphragm, such as a flat diaphragm.

(10) In the embodiments and the modifications mentioned above, the holding rotator 3 that holds the substrate W rotates the held substrate W. When there is no need to rotate the substrate W, the holding rotator 3 does not necessarily rotate the substrate W. Here, the holding rotator 3 corresponds to the substrate holder in the present invention.

(11) In the embodiments and the modifications mentioned above, the downstream pumping apparatus 25 includes three openings (the first opening 55A, the second opening 55B, and the third opening 55C). Alternatively, the downstream pumping apparatus 25 may further include one opening or two or more openings. The same is applicable to the upstream pumping apparatus 73.

(12) Instead of combination of the chamber 40, 75 and the diaphragms 43, 83 in the embodiments and the modifications mentioned above, an elastic tubular member 114 as in FIG. 14 may be used. The following describes this modification. The pumping apparatus 110 includes a pump body 110A, and on-off valves V1 to V3. The pump body 110A includes a chamber body 112, the tubular member 114, a drive mechanism 116, the first opening 55A, the second opening 55B, and the third opening 55C. Here, the on-off valves V1 to V3, the first opening 55A, the second opening 55B, and the third opening 55C are each represented by the same numerals of the elements in the downstream pumping apparatus 25 of Embodiment 1, respectively.

The tubular member 114 whose central axis CT is vertically located surrounds the reservoir 118 (in the chamber body 112). The tubular member 114 contacts the reservoir 118. The drive mechanism 116 causes a body of the tubular member 114 to be displaced, whereby a volume of the reservoir 118 is changed. The first opening 55A and the third opening 55C are provided around the bottom of the reservoir 118. The second opening 55B is provided around the ceiling of the reservoir 118, or the highest position. The chamber (chamber body 112) includes a conical or pyramidal slope 120 such that the upper sectional area of the reservoir 118 becomes smaller toward the highest position of the reservoir 118. The second opening 55B discharges the air bubbles within the treatment solution that is guided along the slope 120.

With such a configuration, the slope 120 causes the air bubbles not to stagnate but to be guided to the second opening 55B along the upper slope 120 while preventing the air bubbles in the treatment solution from being fed out from the third opening 55C of the chamber 33. This makes easy discharge of the air bubbles out of the chamber 33. The drive mechanism 116 is not necessarily moved by the motor M1, but may use hydraulic pressure or air pressure to deform the tubular member 114. Moreover, the second opening 55B is formed at a position including the highest position TP.

(13) In the embodiments and the modifications mentioned above, the chamber 33 as in FIG. 2 includes the reservoir 48 in the truncated cone shape whose central axis (CT) (see FIG. 4) is horizontal, the diaphragm 43, and the drive mechanism 57. Instead of the diaphragm 43 and the drive mechanism 57, a tubular member and a drive mechanism of FIG. 14 may be provided. In this case, an opening on a first end of both ends of the tubular member contacts the first circular face 49A of the chamber body 40 whereas a second end thereof is blocked. Then, the drive mechanism causes the body of the tubular member to be displaced, whereby a volume of the reservoir 48 is changed. Such is adoptable.

The present invention may be embodied in other specific forms without departing from the spirit or essential attributes thereof and, accordingly, reference should be made to the appended claims, rather than to the foregoing specification, as indicating the scope of the invention.

What is claimed is:

1. A pumping apparatus for feeding a treatment solution, comprising:
    a chamber with a reservoir as an interior space that stores the treatment solution and a movable part that contacts the reservoir, a volume of the reservoir being changed by displacement of the movable part; and
    a drive unit that displaces the movable part;
    the chamber including at least three openings formed therein, a first opening, a second opening, and a third opening, that are in communication with the reservoir,
    the second opening being higher in level than the first and third openings, and being located at the highest position of the reservoir,
    the chamber including a slope on an upper inner wall thereof such that an upper sectional area of the reservoir becomes smaller toward the highest position of the reservoir,
    the reservoir of the chamber forming a frustum with a horizontal central axis, the frustum being surrounded by a first flat face, a second flat face, and a truncated conical circumference face upon the upper inner wall, the first flat face extending vertically, the second flat face being smaller than and parallel to the first flat face, and the truncated conical circumference face being formed by connecting an outer edge of the first flat face and an outer edge of the second flat face,
    the movable part and the truncated conical circumference face being arranged so as to sandwich the first flat face,
    the first opening and the third opening being disposed around a bottom of the reservoir,
    the second opening being located at the highest position of the reservoir formed in the frustum shape,
    the slope being formed by the upper inner wall of the chamber that corresponds to an upper portion of the truncated conical circumference face, and
    the second opening discharging air bubbles within the treatment solution that are guided along the slope.

2. The pumping apparatus according to claim 1, wherein the movable part is a diaphragm provided on the first flat face.

3. The pumping apparatus according to claim 1, wherein the second opening extends obliquely upward on the upper inner wall of the chamber from the inside to the outside.

4. The pumping apparatus according to claim 1, wherein the first opening is used for sucking the treatment solution into the reservoir, and the third opening is used for feeding out the treatment solution within the reservoir by controlling circulation of fluid in synchronization with the displacement of the movable part.

* * * * *